United States Patent
Cok (10) Patent No.: US 7,564,063 B2
(45) Date of Patent: Jul. 21, 2009

(54) COMPOSITE ELECTRODE FOR LIGHT-EMITTING DEVICE

(75) Inventor: Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 359 days.

(21) Appl. No.: 11/387,489

(22) Filed: Mar. 23, 2006

(65) Prior Publication Data

US 2007/0252155 A1 Nov. 1, 2007

(51) Int. Cl.
 *H01L 33/00* (2006.01)
(52) U.S. Cl. .................... 257/79; 257/98; 257/E51.019
(58) Field of Classification Search .................. 257/98, 257/79
See application file for complete search history.

(56) References Cited

U.S. PATENT DOCUMENTS

| | | | |
|---|---|---|---|
| 4,476,292 | A | 10/1984 | Ham et al. |
| 4,769,292 | A | 9/1988 | Tang et al. |
| 5,247,190 | A | 9/1993 | Friend et al. |
| 5,834,893 | A | 11/1998 | Bulovic et al. |
| 5,955,837 | A | 9/1999 | Horikx et al. |
| 6,091,195 | A | 7/2000 | Forrest et al. |
| 6,777,871 | B2 | 8/2004 | Duggal et al. |
| 6,787,796 | B2 | 9/2004 | Do et al. |
| 2001/0026124 | A1 | 10/2001 | Liu et al. |
| 2002/0011783 | A1 | 1/2002 | Hosokawa |
| 2004/0061136 | A1 | 4/2004 | Tyan et al. |
| 2004/0211971 | A1 | 10/2004 | Takei et al. |
| 2004/0217702 | A1 | 11/2004 | Garner et al. |
| 2005/0018431 | A1 | 1/2005 | Shiang |
| 2005/0088084 | A1 | 4/2005 | Cok |
| 2005/0142379 | A1 | 6/2005 | Juni et al. |
| 2005/0194896 | A1 | 9/2005 | Sugita et al. |

(Continued)

FOREIGN PATENT DOCUMENTS

EP   1 406 474   7/2004

(Continued)

OTHER PUBLICATIONS

U.S. Appl. No. 11/387,492 filed Mar. 23, 2006, titled "OLED Device Having Improved Light Output" by Ronald S. Cok et al.

(Continued)

*Primary Examiner*—Marcos D. Pizarro
*Assistant Examiner*—Tifney L Skyles
(74) *Attorney, Agent, or Firm*—Andrew J. Anderson; Raymond L. Owens (57) ABSTRACT

A multi-layer composite electrode for a light-emitting device, comprising: a transparent, conductive layer; a reflective, conductive layer in electrical contact with the transparent, conductive layer; and a light-scattering layer formed between the transparent, conductive layer and the reflective, conductive layer over only a first portion of the transparent, conductive layer, wherein the light-scattering layer is relatively less conductive than the reflective, conductive layer and the reflective, conductive layer is in electrical contact with the transparent, conductive layer over a second portion of the transparent, conductive layer where the light-scattering layer is not formed. Also disclosed is a method of making such a multi-layer composite electrode in a light emitting device, and an organic light-emitting diode (OLED) device comprising such a composite electrode.

16 Claims, 2 Drawing Sheets

U.S. PATENT DOCUMENTS

2007/0120465 A1* 5/2007 Ito et al. ............... 313/504

FOREIGN PATENT DOCUMENTS

| EP | 1 603 367 | 12/2005 |
|---|---|---|
| WO | WO 02/37568 | 5/2002 |
| WO | WO 02/37580 | 5/2002 |
| WO | 2006/113319 | 10/2006 |

OTHER PUBLICATIONS

C. W. Tang and S. A. VanSlyke; "Organic Electroluminescent Diodes"; Applied Physics Letters; vol. 51; No. 12; Sep. 21, 1987; pp. 913-915.

C. W. Tang, S. A. VanSlyke and C. H. Chen; "Electroluminescence Of Doped Organic Thin Films"; Journal of Applied Physics; vol. 65; No. 9; May 1, 1989; pp. 3610-3616.

A. N. Safonov et al; "Modification Of Polymer Light Emission By Lateral Microstructure"; Synthetic Metals; 116; 2001; pp. 145-148.

John M. Lupton et al; "Bragg Scattering From Periodically Microstructured Light Emitting Diodes"; Applied Physics Letters; vol. 77; No. 21; Nov. 20, 2000; pp. 3340-3342.

Tetsuo Tsutsui et al; "Sharply Directed Emission In Organic Electroluminescent Diodes With An Optical-Microcavity Structure"; Applied Physics Letters; vol. 65; No. 15; Oct. 10, 1994; pp. 1868-1870.

Ronald S. Cok, Donald R. Preuss and Yuan-Sheng Tyan; U.S. Appl. No. 11/065,082; filed Feb. 24, 2005; titled "OLE Device Having Improved Light Output".

* cited by examiner

COMPOSITE ELECTRODE FOR LIGHT-EMITTING DEVICE

FIELD OF THE INVENTION

The present invention relates to electrodes for light-emitting devices, and more particularly to composite electrodes comprising a light scattering layer for organic light-emitting diode (OLED) devices for improving light output.

BACKGROUND OF THE INVENTION

Organic light-emitting diodes (OLEDs) are a promising technology for flat-panel displays and area illumination lamps. The technology relies upon thin-film layers of materials coated upon a substrate. However, as is well known, much of the light output from the light-emissive layer in the OLED is absorbed within the device. Because light is emitted in all directions from the internal layers of the OLED, some of the light is emitted directly from the device, and some is emitted into the device and is either reflected back out or is absorbed, and some of the light is emitted laterally and trapped and absorbed by the various layers comprising the device. In general, up to 80% of the light may be lost in this manner.

OLED devices generally can have two formats known as small molecule devices such as disclosed in U.S. Pat. No. 4,476,292 and polymer OLED devices such as disclosed in U.S. Pat. No. 5,247,190. Either type of OLED device may include, in sequence, an anode, an organic light-emitting element, and a cathode. The organic element disposed between the anode and the cathode commonly includes an organic hole-transporting layer (HTL), an emissive layer (EML) and an organic electron-transporting layer (ETL). Holes and electrons recombine and emit light in the EML layer. Tang et al. (Appl. Phys. Lett., 51, 913 (1987), Journal of Applied Physics, 65, 3610 (1989), and U.S. Pat. No. 4,769, 292) demonstrated highly efficient OLEDs using such a layer structure. Since then, numerous OLEDs with alternative layer structures, including polymeric materials, have been disclosed and device performance has been improved.

Light is generated in an OLED device when electrons and holes that are injected from the cathode and anode, respectively, flow through the electron transport layer and the hole transport layer and recombine in the emissive layer. Many factors determine the efficiency of this light generating process. For example, the selection of anode and cathode materials can determine how efficiently the electrons and holes are injected into the device; the selection of ETL and HTL can determine how efficiently the electrons and holes are transported in the device, and the selection of EML can determine how efficiently the electrons and holes be recombined and result in the emission of light, etc. It has been found, however, that one of the key factors that limits the efficiency of OLED devices is the inefficiency in extracting the photons generated by the electron-hole recombination out of the OLED devices. Due to the high optical indices of the organic materials used, most of the photons generated by the recombination process are actually trapped in the devices due to total internal reflection. These trapped photons never leave the OLED devices and make no contribution to the light output from these devices.

A typical OLED device uses a glass substrate, a transparent conducting anode such as indium-tin-oxide (ITO), a stack of organic layers, and a reflective cathode layer. Light generated from the device is emitted through the glass substrate. This is commonly referred to as a bottom-emitting device. Alternatively, a device can include a substrate, a reflective anode, a stack of organic layers, and a top transparent cathode layer. Light generated from the device is emitted through the top transparent electrode. This is commonly referred to as a top-emitting device. In these typical devices, the index of the ITO layer, the organic layers, and the glass is about 2.0, 1.7, and 1.5 respectively. It has been estimated that nearly 60% of the generated light is trapped by internal reflection in the ITO/organic element, 20% is trapped in the glass substrate, and only about 20% of the generated light is actually emitted from the device and performs useful functions.

Figure 7:
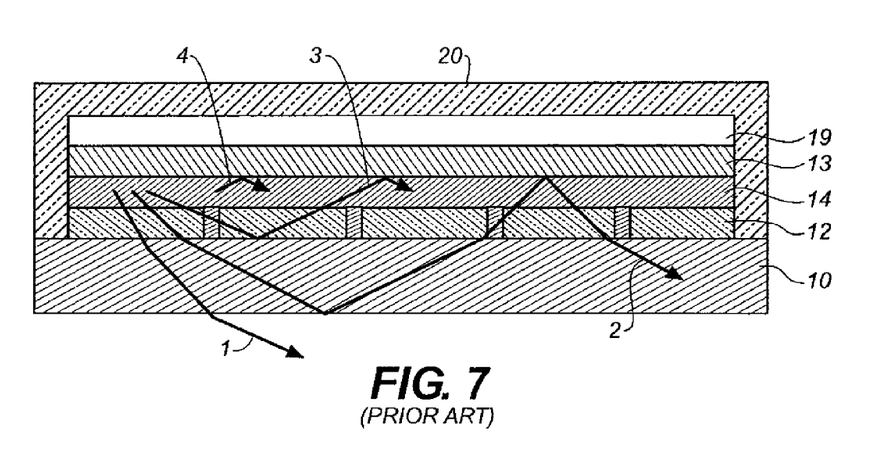
FIG. 7 illustrates a cross section of a prior-art bottom-emitter OLED device.

Referring to FIG. 7, a prior-art bottom-emitting OLED has a transparent substrate 10, a transparent electrode 12, one or more layers 14 of organic material, one of which is light-emitting, a reflective electrode 13, a gap 19 and an encapsulating cover 20. The encapsulating cover 20 may be opaque and may be coated directly over the reflective electrode 13 so that no gap 19 exists. When a gap 19 does exist, it may be filled with polymer or desiccants to add rigidity and reduce water vapor permeation into the device. Light emitted from one of the organic material layers 14 may be emitted directly out of the device, through the substrate 10, as illustrated with light ray 1. Light may also be emitted and internally guided in the substrate 10 and organic layers 14, as illustrated with light ray 2. Alternatively, light may be emitted and internally guided in the layers 14 of organic material, as illustrated with light ray 3. Light rays 4 emitted toward the reflective electrode 13 are reflected by the reflective electrode 13 toward the substrate 10 and then follow one of the light ray paths 1, 2, or 3.

A variety of techniques have been proposed to improve the out-coupling of light from thin-film light emitting devices. One such technique is the use of scattering layers to scatter waveguided light of the layers in which they are trapped. For example, Chou (International Publication Number WO 02/37580 A1) and Liu et al. (U.S. Patent Application Publication No. 2001/0026124 A1) taught the use of a volume or surface scattering layer to improve light extraction. The scattering layer is applied next to the organic layers or on the outside surface of the glass substrate and has optical index that matches these layers. Light emitted from the OLED device at higher than critical angle that would have otherwise been trapped can penetrate into the scattering layer and be scattered out of the device. The efficiency of the OLED device is thereby improved but still has deficiencies as explained below.

U.S. Pat. No. 6,787,796 entitled "Organic electroluminescent display device and method of manufacturing the same" by Do et al issued 20040907 describes an organic electroluminescent (EL) display device and a method of manufacturing the same. The organic EL device includes a substrate layer, a first electrode layer formed on the substrate layer, an organic layer formed on the first electrode layer, and a second electrode layer formed on the organic layer, wherein a light loss preventing layer having different refractive index areas is formed between layers of the organic EL device having a large difference in refractive index among the respective layers. U.S. Patent Application Publication No. 2004/0217702 entitled "Light extracting designs for organic light emitting diodes" by Garner et al., similarly discloses use of microstructures to provide internal refractive index variations or internal or surface physical variations that function to perturb the propagation of internal waveguide modes within an OLED. When employed in a top-emitter embodiment, the use of an index-matched polymer adjacent the encapsulating cover is disclosed. US20050142379 A1 entitled "Electroluminescence device, planar light source and display using the same" describes an organic electroluminescence device including an organic layer comprising an emissive layer; a pair of electrodes comprising an anode and a cathode, and sandwiching the organic layer, wherein at least one of the electrodes is transparent; a transparent layer provided adjacent to a light extracting surface of the transparent electrode; and a region substantially disturbing reflection and retraction angle of light provided adjacent to a light extracting surface of the transparent layer or in an interior of the transparent layer, wherein the transparent layer has a refractive index substantially equal to or more than the refractive index of the emissive layer.

Light-scattering layers used externally to an OLED device are described in U.S. Patent Application Publication No. 2005/0018431 entitled "Organic electroluminescent devices having improved light extraction" by Shiang and U.S. Pat. No. 5,955,837 entitled "System with an active layer of a medium having light-scattering properties for flat-panel display devices" by Horikx, et al. These disclosures describe and define properties of scattering layers located on a substrate in detail. Likewise, U.S. Pat. No. 6,777,871 entitled "Organic ElectroLuminescent Devices with Enhanced Light Extraction" by Duggal et al., describes the use of an output coupler comprising a composite layer having specific refractive indices and scattering properties. While useful for extracting light, this approach will only extract light that propagates in the substrate (illustrated with light ray 2) and will not extract light that propagates through the organic layers and electrodes (illustrated with light ray 3).

U.S. Patent Application Publication No. 2004/0061136 entitled "Organic light emitting device having enhanced light extraction efficiency" by Tyan et al., describes an enhanced, light-extraction OLED device that includes a light-scattering layer. In certain embodiments, a low-index isolation layer (having an optical index substantially lower than that of the organic electroluminescent element) is employed adjacent to a reflective layer in combination with the light-scattering layer to prevent low-angle light from striking the reflective layer, and thereby minimize absorption losses due to multiple reflections from the reflective layer. The particular arrangement, however, has difficulty in providing an adequate supply of current to all areas of an OLED, since it relies upon a transparent electrode for the distribution of power and it is known that transparent electrodes suffer from inadequate conductivity.

EP1603367 A1 entitled "Electroluminescence Device" discloses an electroluminescent device successively comprising a cathode, an electroluminescent layer, a transparent electrode layer, an evanescent light-scattering layer comprising a matrix composed of a low-refractive material containing light-scattering particles, and a transparent sheet/plate. EP1603367 A1 also includes an internal low-refractive layer to inhibit the propagation of light in a cover or substrate.

Co-pending, commonly assigned U.S. Ser. No. 11/065, 082, filed Feb. 24, 2005, describes the use of a transparent low-index layer having a refractive index lower than the refractive index of the encapsulating cover or substrate through which light is emitted and lower than the organic layers to enhance the sharpness of an OLED device having a scattering element. US 20050194896 describes a nano-structure layer for extracting radiated light from a light-emitting device together with a gap having a refractive index lower than an average refractive index of the emissive layer and nano-structure layer. In various described embodiments, such nano-structure layer may be used in combination with color conversion material or color filter layers.

Materials for forming the transparent electrode of displays are well known in the art and include transparent conductive oxides (TCO's), such as indium tin oxide (ITO); thin layers of metal, such as Al, having a thickness on the order of 20 nm; and conductive polymers such as polythiophene. However, many electrode materials that are transparent, such as ITO, have relatively low conductivity, which may result in a voltage drop across the display. This in turn may cause variable light output from the light emitting elements in the display, resistive heating, and power loss. Resistance can be lowered by increasing the thickness of the transparent electrode, but this decreases transparency.

One proposed solution to this problem is to use an auxiliary electrode above or below the transparent electrode layer and located between the pixels, as taught by US2002/0011783, published Jan. 31, 2002, by Hosokawa. The auxiliary electrode is not required to be transparent and therefore can be of a higher conductivity than the transparent electrode. The auxiliary electrode is typically constructed of conductive metals (Al, Ag, Cu, Au) that are also highly reflective. However, the deposition of the auxiliary electrode typically requires expensive patterning processes. In a bottom-emitting structure, metal layers may be used as the top electrode itself and need not be patterned. However, when combined with a scattering layer adjacent the bottom transparent electrode, such a structure requires that the OLED material layers be formed over the scattering layer. Since scattering layers typically include particles with sharp edges, electrical shorts between the electrodes often result, making the OLED inoperative.

There is a need therefore for improved light-emitting device structures and electrodes that provide improved power distribution and manufacturability as well as greater light-emission efficiency.

SUMMARY OF THE INVENTION

In accordance with one embodiment, the invention is directed towards a multi-layer composite electrode for a light-emitting device, comprising: a transparent, conductive layer; a reflective, conductive layer in electrical contact with the transparent, conductive layer; and a light-scattering layer formed between the transparent, conductive layer and the reflective, conductive layer over only a first portion of the transparent, conductive layer, wherein the light-scattering layer is relatively less conductive than the reflective, conductive layer and the reflective, conductive layer is in electrical contact with the transparent, conductive layer over a second portion of the transparent, conductive layer where the light-scattering layer is not formed. In further embodiments, the invention is further directed towards a method of making such a multi-layer composite electrode in a light emitting device, and to an organic light-emitting diode (OLED) device comprising such a composite electrode.

ADVANTAGES

The present invention has the advantage that it provides electrodes that enable improved power distribution and manufacturability as well as greater light-emission efficiency in light emitting devices.

It will be understood that the figures are not to scale since the individual layers are too thin and the thickness differences of various layers too great to permit depiction to scale.

DETAILED DESCRIPTION OF THE INVENTION

Figure 1:
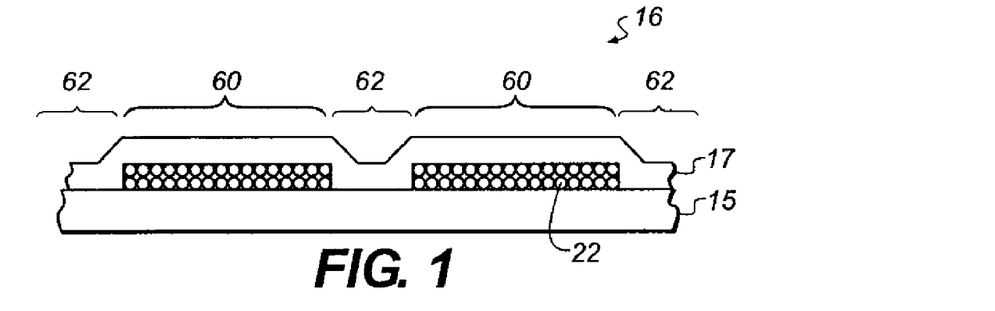
FIG. 1 is a side view of a multi-layer composite electrode having a scattering layer according to one embodiment of the present invention.

Referring to FIG. 1, in accordance with one embodiment of the present invention, a multi-layer composite electrode 16 for an OLED device comprises a transparent, conductive layer 15 and a reflective, conductive layer 17 in electrical contact with the transparent, conductive layer 15. A light-scattering layer 22 is formed between the transparent, conductive layer 15 and the reflective, conductive layer 17 over only first portion 60 of the transparent, conductive layer 15. Light-scattering layer 22 is relatively less conductive than the reflective, conductive layer 17 and the reflective, conductive layer 17 is in electrical contact with the transparent, conductive layer 15 over second portion 62 of the transparent, conductive layer 15 where the light-scattering layer 22 is not formed. In various embodiments, the scattering layer 22 may comprise transparent refractive particles, reflective particles, and/or conductive particles.

In various embodiments of the present invention, the transparent, conductive electrode 15 may comprise a metal oxide, for example indium tin oxide (ITO), or indium zinc oxide (IZO) deposited by sputtering and may further include other layers to enhance injection of holes or electrons into organic layers of an OLED device, for example lithium deposited by evaporation. The reflective, conductive layer 17 may comprises a metal or metal alloy, for example silver, aluminum, or magnesium, or an alloy of silver, aluminum, or magnesium and may be deposited by sputtering or evaporation. As employed herein, a light-scattering layer 22 is an optical layer that tends to randomly redirect any light that impinges on the layer from any direction. As used herein, a transparent electrode or layer is one that passes some light and includes materials that are semi-transparent, partially reflective, or partially absorptive.

Figure 2:
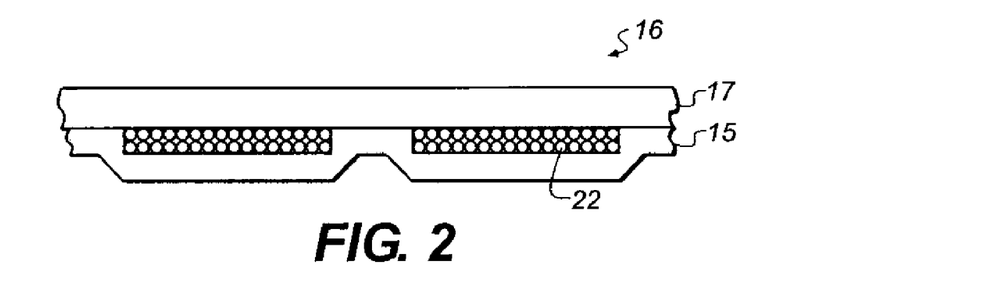
FIG. 2 is a side view of a multi-layer composite electrode having a scattering layer according to an alternative embodiment of the present invention.
Figure 5:
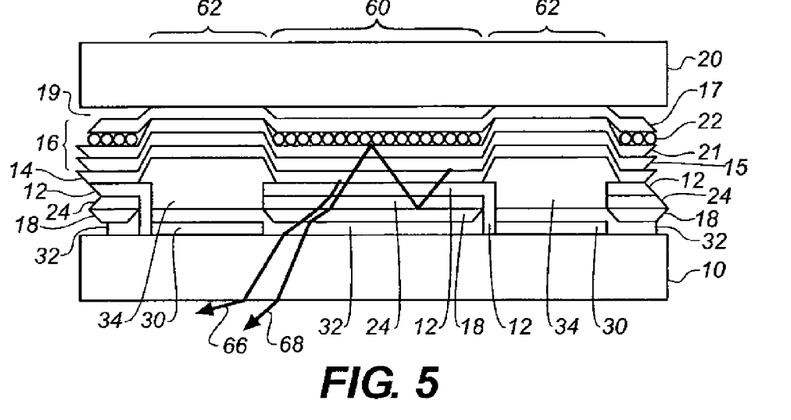
FIG. 5 is a side view of an OLED device having a multi-layer composite electrode with a protective layer and an optical isolation layer according to an embodiment of the present invention.
Figure 6:
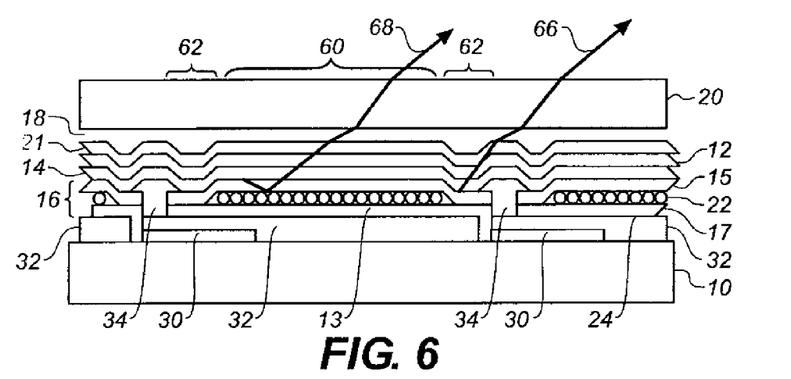
FIG. 6 is a side view of an OLED device having a multi-layer composite electrode with a protective layer in an alternative location and an optical isolation layer according to another embodiment of the present invention.

Because the multi-layer composite electrode has at least two layers in the second portions 62 and at least three layers in first portions 60, it may have a variable thickness. As shown in FIG. 1, the transparent, conductive layer 15 may be substantially planar and the reflective, conductive layer 17 may have a surface profile such that the multi-layer composite electrode 16 is thicker in the first portions 60 and thinner in the second portions 62. Such a structure may be made by depositing light-scattering materials in a patterned arrangement, for example by employing inkjet deposition techniques. Alternative techniques are also possible, for example by using surface treatments that provide a hydrophobic or hydrophilic patterned surface on which materials are deposited. The reflective, conductive layer 17 may then be coated over the light-scattering layer 22 and transparent, conductive layer 15, forming electrical connections with the transparent, conductive layer 15 in the portion 62. Alternatively, referring to FIG. 2, the reflective, conductive layer 17 may be substantially planar, and the transparent, conductive electrode 15 may have a surface profile such that the multi-layer composite electrode 16 is thicker in the first portions 60 and thinner in the second portions 62. In other embodiments, portions of either the reflective, conductive layer 17 or the transparent, conductive electrode 15 may be thicker than other portions. The preferred locations of the multi-layer composite electrode portions 60 and/or 62 will depend on the specific structure of the OLED device of which it is a part. In particular, the underlying layers of the OLED device may determine the profile as illustrated in FIGS. 5 and 6. It is possible that underlying layers specify the portions 60 and 62 and that only some portions of the multi-layer composite electrode will be substantially planar. Alternatively, no portions of the multi-layer composite electrode may be substantially planar.

Figure 3:
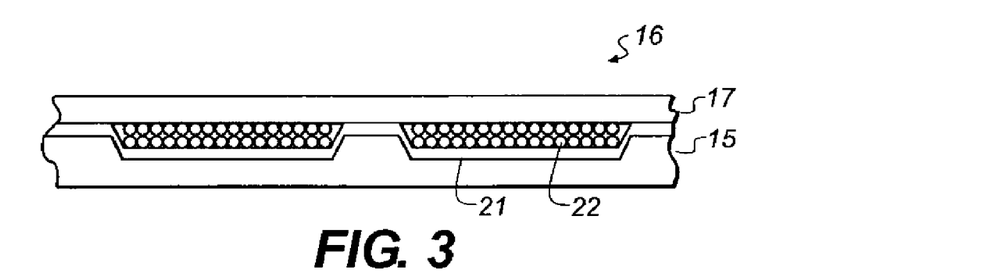
FIG. 3 is a side view of a multi-layer composite electrode having a scattering layer and a protective layer according to yet another embodiment of the present invention.

Referring to FIG. 3, in a further embodiment of the present invention, a protective layer 21 may be formed over the transparent, conductive layer 15 between the transparent, conductive layer 15 and the light-scattering layer 22. Furthermore, in a preferred embodiment, the protective layer 21 may be unpatterned and conductive and may comprise a metal oxide, for example zinc oxide, indium tin oxide, or indium zinc oxide, with or without doping to enhance or modify the conductivity and protective capabilities of the protective layer 21. Such a layer may be structurally different from the transparent, conductive layer 15, for example by deposition through methods such as chemical vapor deposition (CVD) or atomic layer deposition (ALD) known in the art. Alternatively, the scattering layer may be formed by uniformly coating a layer over the first and second portions, and pattern-wise removing the layer over the second portions. Photolithographic techniques may be employed and the scattering particles may be located in a binder or matrix that may itself be patternable, for example by employing curable resin.

Layers deposited by such techniques have been demonstrated by applicant to provide a useful protective layer. If the protective layer 21 is not conductive, it must be patterned and formed in the portions 60 but not in portions 62 to protect the conductive, transparent layer 15 from the scattering layer 22 without disabling the electrical connection between the transparent and reflective layers 15 and 17.

The present invention provides an advantage in that the conductive layers 15 and 17 need not be patterned. It is known that patterning suitably conductive materials in the presence of organic materials is difficult, particularly for sputtering and for evaporation, which may require precision mechanical masks. High process temperatures may also be required to provide adequate performance in such layers. The protective layer 21 also may not need to be patterned, providing further manufacturing process advantages. It is easier to pattern the scattering layer, particularly in the presence of a protective layer 21, by employing deposition means such as inkjets or patterning methods compatible with the chemistry of the protective layer 21, for example by forming a solution comprising light-scattering particles in a matrix, uniformly coating the solution over the first and second portions, and then using photo-lithographic techniques to pattern the scattering layer 22 by pattern-wise removing the coated layer over the second portions 62.

In further preferred embodiments, the protective layer 21 may have an optical refractive index greater than or equal to the optical refractive index of the transparent, conductive layer 15. For example, zinc oxide having an optical index (e.g. 1.95) greater than that of indium tin oxide (e.g. 1.8) may be employed. Alternatively, the protective layer 21 may have an optical refractive index within 10% of the optical refractive index of the transparent, conductive layer 15. By employing layers having such refractive indices, light emitted from the organic layer(s) of an OLED device may travel through the transparent, conductive layer 15 to be scattered by the light-scattering layer 22 and/or reflected from the reflective, conductive layer 17 rather than being internally reflected from the interface between the protective layer 21 and the transparent, conductive layer 15 and thereby being trapped in the OLED device. Reflected light may be waveguided within the protective layer 21, but will re-encounter the scattering layer 22 before the light has traveled a significant distance and be re-scattered.

Figure 4:
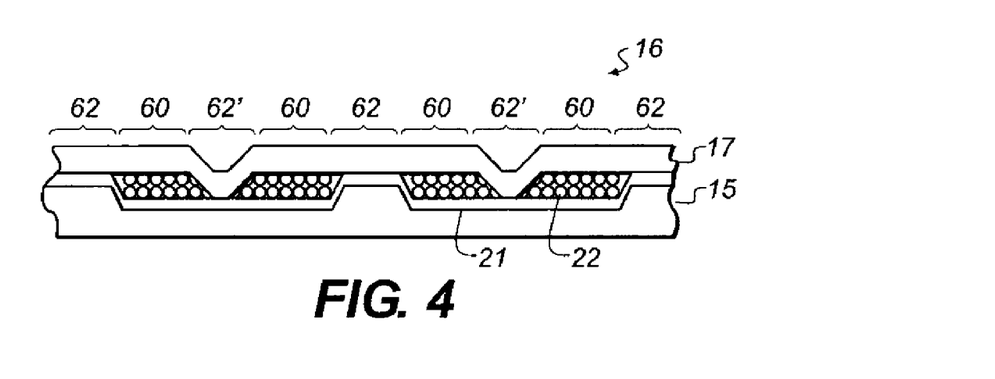
FIG. 4 is a side view of a multi-layer composite electrode having a scattering layer, a protective layer, and additional electrical connections between the conductive layers according to yet another embodiment of the present invention.

Referring to FIG. 4, the scattering layer 22 may be patterned, and an electrical connection may be formed between the transparent conductive layer 15 and the reflective conductive layer 17, in one or more locations between underlying structures formed by the display device. In particular, if underlying structures corresponding to the edges of pixels in a display device are employed to contain the scattering layer 22, the underlying structures may be used to form second portions 62. Additional second portions 62' may be formed in the middle of the pixel areas, thereby improving the electrical connection between the transparent conductive layer 15 and the reflective conductive layer 17. This can be very useful if the first portions 60 would otherwise be very large and the lower conductivity of the transparent, conductive layer 15 would cause a problem in power distribution to underlying layers.

Multi-layer composite electrodes of the present invention are particularly useful as reflective electrodes in light-emitting devices, such as organic light-emitting diode (OLED) devices comprising a substrate, a transparent electrode, a reflective electrode, and one or more layers of organic light-emitting material formed between the transparent and reflective electrodes. Such composite electrodes may be employed in bottom-emitting (FIG. 5) or top-emitting (FIG. 6) arrangements.

Referring to FIG. 5, the multi-layer composite electrode 16 of the present invention may be employed as the top electrode of a bottom-emitting active-matrix OLED device. Such a device may employ active-matrix circuitry that includes thin-film electronic components 30 for driving an OLED formed in a semi-conducting layer located over a substrate 10. An interlayer insulating and planarizing layer 32 may be formed over the thin-film electronic components 30. A bottom transparent conductive electrode layer 12 may be formed over the substrate 10 with one or more layers 14 of organic light-emitting material formed over the bottom transparent layer 12. Composite electrode 16 is formed over organic layers 14, comprising light-scattering layer 22 formed between a transparent, conductive layer 15 and a reflective, conductive layer 17 over only a first portion 60 of the transparent, conductive layer 15, wherein the light-scattering layer 22 is relatively less conductive than the reflective, conductive layer 17 and the reflective, conductive layer 17 is in electrical contact with the transparent, conductive layer 15 over a second portion 62 of the transparent, conductive layer 15 where the light-scattering layer 22 is not formed. For such applications, only a coarse patterning of the scattering layer 22 may be necessary, provided the transparent conductive layer 15 has adequate conductivity to conduct current from portions 62 to the entire extent of portions 60. Such coarse patterning may be especially useful when the present invention is employed in a passive-matrix configuration, for example in a low-resolution display, illumination lamp, or a backlight.

Referring to FIG. 6, the multi-layer composite electrode 16 of the present invention may be employed as the bottom electrode of a top-emitting active-matrix OLED device. Such a device may employ active-matrix circuitry that includes thin-film electronic components 30 for driving an OLED formed in a semi-conducting layer located over a substrate 10. An interlayer insulating and planarizing layer 32 may be formed over the thin-film electronic components 30. A multi-layer composite electrode 16 may be formed over the substrate 10 with one or more layers 14 of organic light-emitting material formed over the multi-layer composite electrode 16. A transparent top electrode 12 is formed over the organic layers 14 and a protective layer 21 may be employed over the top electrode 12. A transparent cover 20 may be affixed to the substrate 10 to further protect the OLED device. In such embodiment, composite electrode 16 comprises reflective, conductive layer 17 formed over the substrate 10; transparent, conductive layer 15 formed over and in electrical contact with the reflective, conductive layer 17; and light-scattering layer 22 formed between the transparent, conductive layer and the reflective, conductive layer over only a first portion 60 of the transparent, conductive layer 15, wherein the light-scattering layer 22 is relatively less conductive than the reflective, conductive layer 17 and the reflective, conductive layer 17 is in electrical contact with the transparent, conductive layer 15 over a second portion 62 of the transparent, conductive layer 15 where the light-scattering layer 22 is not formed.

As further illustrated in FIGS. 5 and 6, a transparent low-index optical isolation layer 18 (possibly an air gap) having a refractive index lower than the refractive index of the encapsulating cover or substrate through which light is emitted from the OLED device and lower than the refractive index of the OLED element material layers 14 may be employed between the transparent electrode 12 and the cover or substrate through which light is emitted to improve the sharpness of the OLED device, as is disclosed in co-pending, commonly assigned U.S. Ser. No. 11/065,082, filed Feb. 24, 2005, the disclosure of which is hereby incorporated by reference. The optical isolation layer 18 may be formed over the substrate 10 and located between the scattering layer 22 and the cover 20 (in a top-emitter) or substrate 10 (in a bottom-emitter) through which light is emitted and can improve the sharpness of a pixellated OLED device. The optical isolation layer 18 may comprise a solid layer, a void, or a gap filled with air, helium, nitrogen, or argon. A suitable solid material, for example a low-index polymer, may be employed, but such solid material must have an optical index lower than that of the organic layers 14 and cover 20 or substrate 10 through which light is emitted. Preferably, the optical isolation layer 18 is at least one micron thick, and more preferably at least two microns thick. Since the low-index layer or gap 18 has an optical index lower than that of the OLED elements and the cover or substrate through which light is emitted, any light that is scattered into the layer 18 by the scattering layer will pass through the low-index layer and the cover or substrate, since light passing from a low-index material (layer 18) into a higher index material (the cover or substrate) cannot experience total internal reflection, although it can still experience the much smaller Fresnel reflection.

As shown in FIG. 6, the optical isolation layer 18 is formed between the protection layer 21 and the cover 20. To reduce reflection from the protective layer 21, the protective layer 21 preferably has an optical refractive index greater than or equal to the optical refractive index of the transparent electrode 12. Referring back to FIG. 5, the optical isolation layer 18 is formed as a cavity between the planarization layer 32 and a supportive layer 24. The supportive layer 24 may be the same layer as the transparent, conductive layer 12. To reduce reflection from the protective layer 21 in the bottom-emitting embodiment of FIG. 5, the protective layer 21 preferably has an optical refractive index greater than or equal to the optical refractive index of the transparent, conductive layer 15.

In a specific embodiment of the invention, a multi-layer composite electrode in a light emitting device may be made according to method comprising the steps of providing a substrate having a light-emitting layer coated thereon; coating a transparent, conductive layer over the light-emitting layer; forming a light-scattering layer over only a first portion of the transparent, conductive layer; and coating a reflective, conductive layer over the light-scattering layer and the transparent, conductive layer, wherein the light-scattering layer is relatively less conductive than the reflective, conductive layer and the reflective, conductive layer is coated in electrical contact with the transparent, conductive layer over a second portion of the transparent, conductive layer where the light-scattering layer is not formed. Scattering layer 22 may be conveniently deposited over the transparent, conductive layer 15 in a solvent, and the organic layer(s) 14 and the transparent, conductive layer 15 may be extremely sensitive to environmental contamination. Accordingly, the presence of the protective layer 21 over the transparent, conductive layer can improve the manufacturability of the OLED device. Such a protective layer 21 may be formed by chemical vapor depositing or atomic layer depositing materials such as, for example, zinc oxide preferably having an index equal to or higher than the index of the adjacent electrode. Moreover, the underlying structures in the OLED device forming second portions 62 higher than first portions 60, for example using insulator 34, may be usefully employed to form wells corresponding to the light emitting area and first portions 60. The wells can be employed to contain material, for example particles, forming the scattering layer 22.

In further specific embodiments of the present invention the transparent, conductive layer 15 may comprise a metal oxide layer sputter-coated over the light-emitting layer; the light-scattering layer 22 may comprise light-scattering particles and a binder ink-jet deposited over the first portion 60 of the transparent, conductive layer 15; and the reflective, conductive layer 17 may comprise a metallic layer evaporated or sputter-coated over the light-scattering layer 22 and the transparent, conductive layer 15.

The optical isolation layer 18 shown in FIG. 5 may be formed by depositing a sacrificial layer over for example, the insulating and planarizing layer 32. A second layer 24 may then be formed over the sacrificial layer, the second layer 24 having openings exposing portions of the sacrificial layer. An etchant may then be employed to etch the materials of the sacrificial layer away, leaving a void beneath the second layer 24 forming the optical isolation layer 18. Further layers, for example the scattering layer 22 or bottom transparent electrode 12 may be formed over the second layer 24. Alternatively, such layers as the bottom transparent electrode 12 may be employed as the second layer 24 and no intermediate, covering layer may be necessary to form a layer over the optical isolation layer 18. The second layer 24 may be supported over the void comprising the optical isolation layer 18 by walls adjacent to the light emitting areas or by pillars of material formed in the light-emissive area corresponding to first portion 60. In such an embodiment, the sacrificial layer is formed only in the light-emissive area corresponding to first portion 60. Materials and etchants known in the photolithographic industry may be employed to form the sacrificial layer and/or second layer 24. For example, the sacrificial layer may comprise polysilicon or a silicon oxide. The second layer may comprise a silicon nitride or a silicon oxide. The choice of materials will depend greatly on the choice of etchants, for example XeFl can etch polysilicon. Applicants have formed suitable voids by employing a sacrificial layer of polysilicon formed over a silicon dioxide layer with a second layer of silicon nitride having openings exposing portions of the first sacrificial layer and then etching away the polysilicon sacrificial layer using XeFl gas. In an alternative embodiment, the sacrificial layer may be silicon dioxide covered with indium tin oxide (ITO) and hydrofluoric acid employed to etch out the silicon dioxide sacrificial layer. In this embodiment, the ITO layer may serve as a transparent electrode. Such techniques are described in U.S. Pat. No. 6,238,581 entitled "Process for manufacturing an electro-mechanical grating device". Further details with respect to formation of a low-index layer or gap in a bottom-emitting embodiment are discussed in U.S. Ser. No. 11/387,492 filed Mar. 23, 2006 by Ronald S. Cok et al., the disclosure of which is incorporated by reference herein.

In an alternative process, a low-index material may first be formed and the remainder of the OLED structure formed over the low-index material. Preferably, the low-index material may have a refractive index close to one, for example an aerogel may be employed. Such an aerogel may be formed, for example, by employing a sol-gel process with MgF to make a coating with a refractive index of 1.15 using nano-particles. Suitable materials and processes are known in the art.

In preferred embodiments, the cover 20 and substrate 10 may comprise glass or plastic with typical refractive indices of between 1.4 and 1.6. Reflective, conductive layer 17 is preferably made of metal (for example aluminum, silver, or magnesium) or metal alloys. Transparent electrode 12 and transparent, conductive layer 15 are preferably made of transparent conductive materials, for example indium tin oxide (ITO) or other metal oxides. The organic material layers 14 may comprise organic materials, for example, hole-injection, hole-transport, light-emitting, electron-injection, and/or electron-transport layers. Such organic material layers are well known in the OLED art. The organic material layers typically have a refractive index of between 1.6 and 1.9, while indium tin oxide has a refractive index of approximately 1.8-2.0. Hence, the various layers 12 and 14 in the OLED have a refractive index range of 1.6 to 2.1. Of course, the refractive indices of various materials may be dependent on the wavelength of light passing through them, so the refractive index values cited here for these materials are only approximate. In any case, the optical isolation layer 18 preferably has a refractive index at least 0.1 lower than that of the organic layers and even more preferably has a refractive index close to 1.

Scattering layer 22 may comprise a volume scattering layer or a surface scattering layer. In certain embodiments, e.g., scattering layer 22 may comprise materials having at least two different refractive indices. The scattering layer 22 may comprise, e.g., a matrix of lower refractive index and scattering elements have a higher refractive index. Alternatively, the matrix may have a higher refractive index and the scattering elements may have a lower refractive index. For example, the matrix may comprise silicon dioxide or cross-linked resin having indices of approximately 1.5, or silicon nitride with a much higher index of refraction. If scattering layer 22 has a thickness greater than one-tenth part of the wavelength of the emitted light, then it is desirable for the index of refraction of at least one material in the scattering layer 22 to be approximately equal to or greater than the index of the organic materials or transparent electrode. This is to insure that all of the light trapped in the organic layers 14 and transparent electrodes can experience the direction altering effects of scattering layer 22. If scattering layer 22 has a thickness less than one-tenth part of the wavelength of the emitted light, then the materials in the scattering layer need not have such a preference for their refractive indices. In an alternative embodiment, scattering layer 22 may comprise particles deposited on another layer, e.g., particles of titanium dioxide may be coated over transparent, conductive layer 15 to scatter light. Preferably, such particles are at least 100 nm in diameter to optimize the scattering of visible light.

According to an embodiment of the present invention, light emitted from the organic layers 14 can waveguide along the organic layers 14 and transparent layers 12 and 15 combined, since the organic layers 14 have a refractive index lower than that of the transparent electrode 12 and layer 15. The scattering layer 22 may disrupt the total internal reflection of light in the combined layers 14, 12 and 15 and redirect some portion of the light out of the combined layers.

Referring to FIGS. 5 and 6, in operation light is emitted from the organic layer(s) 14 after stimulation by a current passing from one electrode to the other. Current supplied by reflective, conductive layer 17 passes into the transparent, conductive layer 15 through areas 62 and then distributed through the areas 60 by the transparent, conductive layer 15. Light rays 66 and 68 are formed and may be directly emitted (66) or may be reflected back toward the light-scattering layer 22, encounter the light-scattering layer 22 one or more times before the light ray (68) is scattered into an angle that allows it to escape from the device. Light initially emitted toward the back of the OLED is scattered by the light-scattering layer 22 and either passes out of the OLED device or is reflected by another layer until it is scattered again. Light that is scattered from the light-scattering layer 22 toward the reflective, conductive layer 17 is reflected toward the light-scattering layer 22 and redirected out of the device or back toward the reflective, conductive layer 17 or reflected from some other layer interface in the OLED until it re-encounters the light-scattering layer 22 again. Light that is emitted in areas 62 that do not have a scattering layer 22 may be reflected and waveguided through the various organic and transparent conductive layers until they encounter a scattering area 60 before they are scattered. While this may increase absorption for those light rays, the areas 62 can be relatively small in comparison to areas 60, minimizing any losses. The protective layer 21 (for example comprising zinc oxide) having an optical refractive index higher than that of the transparent, conductive layer 15 (for example comprising indium tin oxide) will not trap any light emitted from the organic layers 14 or passing through the transparent, conductive layer 15. Light scattered by the scattering layer 22 may be trapped in the protective layer 21 (since it has a higher index than the transparent, conductive layer 15), but since this layer is very thin, any light so trapped will quickly encounter the scattering layer 22 again before traveling a significant distance laterally and then be scattered out of the protective layer 21. If the scattering layer 22 comprises transparent, refractive particles, the light is first scattered by the particles; those that are scattered toward the reflective, conductive layer 17 are reflected back through the transparent, refractive particles. If the scattering layer 22 comprises reflective particles, the light is scattered by the particles and may be reflected back by the reflective particles toward the organic layers 14, although some portion of the light may still be reflected back by the reflective, conductive layer 17. In the latter case, metallic particles may be employed that also provide a conductive scattering layer that may also serve to conduct current through the scattering layer from the reflective, conductive layer 17 to the transparent, conductive layer 15, thus enhancing the power distribution in the device. Metallic particles or particles coated with metallic layers may be particularly useful for these purposes.

The reflective, conductive layer 17 (for example comprising silver or aluminum) can be very thick (for example greater than 100 nm) and carry large amounts of current. Since the reflective, conductive layer 17 is electrically connected to the transparent, conductive layer 15 in portions 62, the current distribution in the OLED device is thereby improved despite the relatively low conductivity of the transparent, conductive layer 15. While the scattering layer 22 may also be conductive, it is difficult to make scattering materials that are not light-absorbing and are also conductive. Hence, the present invention provides an electrode having a scattering layer within an OLED device that does not create shorts between electrodes and does provide good current distribution in the OLED. The use of a conductive, protective layer 21 (for example zinc oxide with or without dopants) further improves the current distribution in the transparent, conductive layer 15 while enabling deposition of scattering layer 22 without requiring patterning of the transparent, conductive layer 15, transparent, protective layer 21, or transparent, reflective layer 17.

For applications in which device sharpness is important (e.g. display devices having pixels), it is critical that the optical isolation layer 18 (FIGS. 5 and 6) provide an optically transparent layer having a refractive index lower than that of the layers adjacent to it, since light passing from a low-index medium (the optical isolation layer 18) into a higher-index medium (substrate 10 and underlying planarization and insulation layers 32 or cover 20) cannot experience total internal reflection and must be emitted. Hence, light will not experience the losses due to repeated transmission through the substrate 10, or demonstrate the lack of sharpness that results from light being emitted from the organic layers 14 at one point and emitted from the substrate 10 at a distant point. To facilitate this effect, the optical isolation layer 18 should not itself scatter light, and should be as transparent as possible. The optical isolation layer 18 is preferably at least one micron thick to ensure that emitted light properly propagates through the optical isolation layer 18 and is transmitted through the substrate 10.

Whenever light crosses an interface between two layers of differing index (except for the case of total internal reflection), a portion of the light is reflected and another portion is refracted. Unwanted reflections can be reduced by the application of standard thin anti-reflection layers. Use of anti-reflection layers may be particularly useful on both sides of the transparent substrate 10.

The light-scattering layer 22 can employ a variety of materials. For example, randomly located particles of titanium dioxide may be employed in a matrix of polymeric material. Alternatively, a more structured arrangement employing ITO, silicon oxides, or silicon nitrides may be used. Shapes of refractive elements may be cylindrical, rectangular, or spherical, but it is understood that the shape is not limited thereto. The difference in refractive indices between materials in the light-scattering layer 22 may be, for example, from 0.3 to 3, and a large difference is generally desired. The thickness of the light-scattering layer, or size of features in, or on the surface of, a light-scattering layer may be, for example, 0.03 to 50 μm. It is generally preferred to avoid diffractive effects in the light-scattering layer. Such effects may be avoided, for example, by locating features randomly or by ensuring that the sizes or distribution of the refractive elements are not the same as the wavelength of the color of light emitted by the device from the light-emitting area.

The light-scattering layer 22 should be selected to get the light out of the OLED as quickly as possible so as to reduce the opportunities for re-absorption by the various layers of the OLED device. The light-scattering layer 22 may have a high total diffuse transmittance (preferably greater than 80%). When coupled with the reflective, conductive layer 17, light that passes through the scattering layer is redirected toward the substrate 10 in a bottom-emitting device, or toward the cover 20 in a top-emitting device. Alternatively, the light-scattering layer 22 may have a high total diffuse reflectance (preferably greater than 80%) so that little light is reflected from the reflective, conductive layer 17. In all cases, the absorption of the light-scattering layer should be as low as possible (preferably less than 5%, and ideally 0%).

Materials of the light-scattering layer 22 can include organic materials (for example polymers or electrically conductive polymers) or inorganic materials. The organic materials may include, e.g., one or more of polythiophene, PEDOT, PET, or PEN. The inorganic materials may include, e.g., one or more of $SiO_x$ (x>1), $SiN_x$ (x>1), $Si_3N_4$, $TiO_2$, MgO, ZnO, $Al_2O_3$, $SnO_2$, $In_2O_3$, $MgF_2$, and $CaF_2$. The light-scattering layer 22 may comprise, for example, silicon oxides and silicon nitrides having a refractive index of 1.6 to 1.8 and doped with titanium dioxide having a refractive index of 2.5 to 3. Polymeric materials having refractive indices in the range of 1.4 to 1.6 may be employed having a dispersion of refractive elements of material with a higher refractive index, for example titanium dioxide.

Conventional lithographic means can be used to create the scattering layer using, for example, photo-resist, mask exposures, and etching as known in the art. Alternatively, coating may be employed in which a liquid, for example polymer having a dispersion of titanium dioxide, may form a light-scattering layer 22. Such materials may be pattern-wise applied in first portions 60, for example, by employing ink jet devices. A transparent, conductive layer 15 and/or a reflective, conductive layer 17 may be formed, for example, through evaporation or sputtering using methods known in the art.

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890 issued May 8, 2001 to Boroson et al. In addition, barrier layers such as $SiO_x$ (x>1), Teflon, and alternating inorganic/polymeric layers are known in the art for encapsulation.

OLED devices of this invention can employ various well-known optical effects in order to enhance their properties if desired. This includes optimizing layer thicknesses to yield maximum light transmission, providing dielectric mirror structures, providing anti-glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

The present invention may also be practiced with either active- or passive-matrix OLED devices. It may also be employed in display devices or in area illumination devices. In a preferred embodiment, the present invention is employed in a flat-panel OLED device composed of small molecule or polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. Many combinations and variations of organic light-emitting displays can be used to fabricate such a device, including both active- and passive-matrix OLED displays having either a top- or bottom-emitter architecture.

The invention has been described in detail with particular reference to certain preferred embodiments thereof, but it will be understood that variations and modifications can be effected within the spirit and scope of the invention.

PARTS LIST 1, 2, 3, 4 light rays
10 substrate
12 transparent electrode
13 reflective electrode
14 organic layer(s)
15 transparent, conductive layer
16 multi-layer composite electrode
17 reflective, conductive layer
18 optical isolation layer
19 gap
20 cover
21 protective layer
22 scattering layer
24 supportive layer
30 thin-film electronic components
32 insulating layer
34 insulating layer
60 first portion
62, 62' second portion
66, 68 light rays

The invention claimed is:

1. A multi-layer composite electrode for a light-emitting device, comprising:
   a transparent, conductive layer;
   a reflective, conductive layer in electrical and physical contact wit the transparent, conductive layer; and
   a light-scattering layer formed between the transparent, conductive layer and the reflective, conductive layer over only a first portion of the transparent, conductive layer, wherein the light-scattering layer is relatively less conductive than the reflective, conductive layer and the reflective, conductive layer is in electrical contact with the transparent, conductive layer over a second portion of the transparent, conductive layer where the light-scattering layer is not formed.

2. The composite electrode of claim 1, further comprising a protective layer formed between the transparent, conductive layer and the light-scattering layer.

3. The composite electrode of claim 2, wherein the protective layer is conductive.

4. The composite electrode of claim 2, wherein the protective layer comprises zinc oxide, indium tin oxide, or indium zinc oxide.

5. The composite electrode of claim 2, wherein the protective layer has an optical refractive index greater than or equal to the optical refractive index of the transparent, conductive layer.

6. The composite electrode of claim 2, wherein the protective layer has a structure different from a sputtered or an evaporated layer.

7. The composite electrode of claim 1, wherein the reflective, conductive layer comprises a metal or metal alloy.

8. The composite electrode of claim 1, wherein the transparent, conductive layer and the reflective, conductive layer are substantially planar in the first portions or second portions.

9. The composite electrode of claim 1, wherein the scattering layer comprises transparent refractive particles or reflective particles.

10. The composite electrode of claim 1, wherein the scattering layer comprises conductive particles.

11. An organic light-emitting diode (OLED) device, comprising:
a substrate;
a transparent electrode;
a reflective electrode; and
one or more layers of organic light-emitting material formed between the transparent and reflective electrodes; wherein the reflective electrode comprises a multi-layer composite electrode according to claim 1.

12. An organic light-emitting diode (OLED) device according to claim 11, comprising:
a substrate;
a bottom transparent electrode formed over the substrate;
one or more layers of organic light-emitting material formed over the bottom transparent electrode; and
a composite electrode formed over the one or more layers of organic light-emitting material, the composite electrode comprising a transparent, conductive layer formed over the one or more layers of organic light-emitting material; a reflective, conductive layer formed over and in electrical contact with the transparent, conductive layer; and a light-scattering layer formed between the transparent, conductive layer and the reflective, conductive layer over only a first portion of the transparent, conductive layer, wherein the light-scattering layer is relatively less conductive than the reflective, conductive layer and the reflective, conductive layer is in electrical contact with the transparent, conductive layer over a second portion of the transparent, conductive layer where the light-scattering layer is not formed.

13. The organic light-emitting diode (OLED) device of claim 12, further comprising an optical isolation layer having a refractive index less than the refractive index of the substrate formed between the substrate and the bottom transparent electrode.

14. The OLED device of claim 12, further comprising a protective layer formed over the transparent, conductive layer between the transparent, conductive layer and the light-scattering layer.

15. An organic light-emitting diode (OLED) device according to claim 11, comprising:
a substrate;
a bottom electrode formed over the substrate;
one or more layers of organic light-emitting material formed over the bottom electrode;
a transparent top electrode formed over the one or more layers of organic light-emitting material; and
a cover over the transparent top electrode;
wherein the bottom electrode comprises a composite electrode comprising a reflective, conductive layer formed over the substrate; a transparent, conductive layer formed over and in electrical contact with the reflective, conductive layer; and a light-scattering layer formed between the transparent, conductive layer and the reflective, conductive layer over only a first portion of the transparent, conductive layer, wherein the light-scattering layer is relatively less conductive than the reflective, conductive layer and the reflective, conductive layer is in electrical contact with the transparent, conductive layer over a second portion of the transparent, conductive layer where the light-scattering layer is not formed.

16. The organic light-emitting diode (OLED) device of claim 15, further comprising an optical isolation layer having a refractive index less than the refractive index of the cover formed between the cover and the top transparent electrode.

* * * * *